(12) United States Patent
Klenk et al.

(10) Patent No.: US 12,297,534 B2
(45) Date of Patent: May 13, 2025

(54) PROCESS FOR THE GENERATION OF METAL- OR SEMIMETAL-CONTAINING FILMS

(71) Applicants: BASF SE, Ludwigshafen am Rhein (DE); Wayne State University, Detroit, MI (US)

(72) Inventors: Sinja Verena Klenk, Ludwigshafen am Rhein (DE); Alexander Georg Hufnagel, Ludwigshafen am Rhein (DE); Hagen Wilmer, Ludwigshafen am Rhein (DE); Daniel Löffler, Ludwigshafen am Rhein (DE); Sabine Weiguny, Ludwigshafen am Rhein (DE); Kerstin Schierle-Arndt, Ludwigshafen am Rhein (DE); Charles Hartger Winter, Detroit, MI (US); Nilanka Weerathunga Sirikkathuge, Detroit, MI (US)

(73) Assignees: BASF SE, Ludwigshafen am Rhein (DE); Wayne State University, Detroit, MI (US)

( * ) Notice: Subject to any disclaimer, the term of this patent is extended or adjusted under 35 U.S.C. 154(b) by 204 days.

(21) Appl. No.: 17/778,429

(22) PCT Filed: Nov. 16, 2020

(86) PCT No.: PCT/EP2020/082218
§ 371 (c)(1),
(2) Date: May 20, 2022

(87) PCT Pub. No.: WO2021/099249
PCT Pub. Date: May 27, 2021

(65) Prior Publication Data
US 2023/0046318 A1 Feb. 16, 2023

(30) Foreign Application Priority Data
Nov. 22, 2019 (EP) ..................... 19210908

(51) Int. Cl.
*C23C 16/455* (2006.01)
*C23C 16/18* (2006.01)
(52) U.S. Cl.
CPC ........ *C23C 16/45534* (2013.01); *C23C 16/18* (2013.01); *C23C 16/45553* (2013.01)
(58) Field of Classification Search
CPC ........ C23C 16/45553; C23C 16/45534; C23C 16/18
See application file for complete search history.

(56) References Cited

U.S. PATENT DOCUMENTS

2009/0226612 A1  9/2009  Ogawa et al.
2010/0099257 A1* 4/2010  Shin .................. C23C 16/20
                                                438/681

FOREIGN PATENT DOCUMENTS

CN  101029384 A  *  9/2007  ............. C23C 16/20
EP  1788116 A1  5/2007
WO  2019/201692 A1  10/2019

OTHER PUBLICATIONS

Ashby et al., "Animoalanes, Direct synthesis from aluminum, hydrogen, and secondary amines, Structure and stability elucidation by nuclear magnetic resonance, infrared spectra, and differential thermal and thermal gravimetric analysis", Inorganic Chemistry, vol. 10, Issue 5, 1971, pp. 893-899.
Blakeney et al., "Atomic Layer Deposition of Aluminum Metal Films Using a Thermally Stable Aluminum Hydride Reducing Agent", Chemistery of Materials, vol. 30, No. 6, 2018, pp. 1844-1848.
European Search Report for EP Patent Application No. 19210908.0, Issued on May 12, 2020, 3 pages.
Hansmann et al., "Group 13 BN dehydrocoupling reagents, similar to transition metal catalysts but with unique reactivity", Chemical Science, vol. 2, No. 8, 2011, pp. 1554-1559.
International Preliminary Report on Patentability received for PCT Patent Application No. PCT/EP2020/082218, mailed on Jun. 2, 2022, 9 pages.

(Continued)

*Primary Examiner* — Kelly M Gambetta
(74) *Attorney, Agent, or Firm* — Faegre Drinker Biddle & Reath LLP

(57) ABSTRACT

The present invention is in the field of processes for preparing inorganic metal- or semimetal-containing films. The process for preparing inorganic metal- or semimetal-containing films comprising (a) depositing a metal- or semimetal-containing compound from the gaseous state onto a solid substrate and (b) bringing the solid substrate with the deposited metal- or semimetal-containing compound in contact with a compound of general formula (I) or (II) wherein Z is $NR_2$, $PR_2$, OR, SR, $CR_2$, $SiR_2$, X is H, R' or $NR'_2$, wherein at least one X is H, n is 1 or 2, and R and R' is an alkyl group, an alkenyl group, an aryl group, or a silyl group.

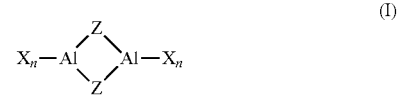

(I)

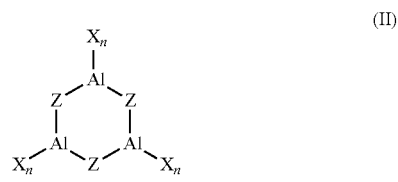

(II)

11 Claims, No Drawings

(56) References Cited

OTHER PUBLICATIONS

Storr et al., "Cyclogallazanes. Part III. (N-polymethylene)cyclogallata-azonianes", Journal of the Chemical Society, Dalton Transactions, Issue 3, 1972, pp. 326-330.

Yang et al., "Direct-liquid-evaporation chemical vapor deposition of smooth, highly conformal cobalt and cobalt nitride thin films", Journal of Materials Chemistry C, vol. 3, Issue 46, Nov. 3, 2015, pp. 12098-12106.

International Search Report and Written Opinion received for PCT Patent Application No. PCT/EP2020/082218, mailed on Dec. 18, 2020, 10 pages.

* cited by examiner

PROCESS FOR THE GENERATION OF METAL- OR SEMIMETAL-CONTAINING FILMS

CROSS-REFERENCE TO RELATED APPLICATIONS

This application is a national stage application (under 35 U.S.C. § 371) of PCT/EP2020/082218, filed Nov. 16, 2020, which claims benefit of European Application No. 19210908.0, filed Nov. 22, 2019, both of which are incorporated herein by reference in their entirety.

The present invention is in the field of processes for the generation of inorganic metal- or semimetal-containing films on substrates, in particular atomic layer deposition processes.

With the ongoing miniaturization, e.g. in the semiconductor industry, the need for thin inorganic films on substrates increases while the requirements on the quality of such films become stricter. Thin metal or semimetal films serve different purposes such as barrier layers, conducting features, or capping layers. Several methods for the generation of metal or semimetal films are known. One of them is the deposition of film forming compounds from the gaseous state on a substrate. In order to bring metal or semimetal atoms into the gaseous state at moderate temperatures, it is necessary to provide volatile precursors, e.g. by complexation of the metals or semimetals with suitable ligands. These precursors need to be sufficiently stable for evaporation, but on the other hand they need to be reactive enough to react with the surface of deposition.

EP 1 788 116 A1 discloses a process for depositing aluminum films from dialkyl amido dihydro aluminum precursors. However, films other than aluminum films are not accessible with this method.

In order to convert deposited metal or semimetal complexes to metal or semimetal films, it is usually necessary to expose the deposited metal or semimetal complex to a reducing agent. Typically, hydrogen gas is used to convert deposited metal or semimetal complexes to metal or semimetal films. While hydrogen is available as a reducing agent for some metals, it usually requires plasma activation. Plasma processes are limited to lower aspect ratios and can result in plasma damage to the substrate. It is therefore desirable to use reducing agent which do not need any plasma activation.

WO 2019/201 692 A1 discloses a process for depositing metal films employing a bicyclic aluminum hydride compound as reducing agent. While this reducing agent generally yields good results, for some demanding applications, higher vapor pressures, stability and/or reduction potential is required.

It was therefore an object of the present invention to provide a process for preparing inorganic metal- or semimetal-containing films having less impurity in the film. The process materials should be easy to handle; in particular, it should be possible to vaporize them with as little decomposition as possible. Further, the process material should not decompose at the deposition surface under process conditions but at the same time it should have enough reactivity to participate in the surface reaction. All reaction by-products should be volatile to avoid film contamination. In addition, it should be possible to adjust the process such that metal or semimetal atoms in the process material are either volatile or are incorporated in the film. Furthermore, the process should be versatile, so it can be applied to produce a broad range of different metals including electropositive metal or semimetal films.

These objects were achieved by a process for preparing inorganic metal- or semimetal-containing films comprising
(a) depositing a metal- or semimetal-containing compound from the gaseous state onto a solid substrate and
(b) bringing the solid substrate with the deposited metal- or semimetal-containing compound in contact with a compound of general formula (I) or (II)

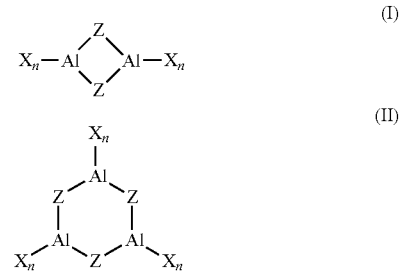

wherein Z is $NR_2$, $PR_2$, OR, SR, $CR_2$, $SiR_2$,
X is H, R' or $NR'_2$, wherein at least one X is H,
n is 1 or 2, and
R and R' is an alkyl group, an alkenyl group, an aryl group, or a silyl group.

The invention further relates to the use of a compound of general formula (I) or (II) as reducing agent in a vapor deposition process.

Preferred embodiments of the present invention can be found in the description and the claims. Combinations of different embodiments fall within the scope of the present invention.

The process according to the present invention is suitable for preparing inorganic metal- or semimetal-containing films. Inorganic in the context of the present invention refers to materials which contain at least 5 wt.-% of at least one metal or semimetal, preferably at least 10 wt.-%, more preferably at least 20 wt.-%, in particular at least 30 wt.-%. Inorganic films typically contain carbon only in the form of a carbide phase including mixed carbide phases such as nitride carbide phases. The carbon content of carbon which is not part of a carbide phase in an inorganic film is preferably less than 5 wt.-%, more preferable less than 1 wt.-%, in particular less than 0.2 wt.-%. Preferred examples of inorganic metal- or semimetal-containing films are metal or semimetal nitride films, metal or semimetal carbide films, metal or semimetal carbonitride films, metal or semimetal alloy films, intermetallic compound films or films containing mixtures thereof.

The film prepared by the process according to the present invention contains metal or semimetal. It is possible that the film contains one metal or semimetal or more than one metal and/or semimetal. Metals include Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Semimetals include B, Si, Ge, As, Sb, Se, Te. Preferably, the metal- or semimetal have an oxide formation energy per oxygen atom which is more exothermic than for Ni. In particular, the metal or semimetal is Ti, Ta, Mn, Mo, W, Ge, Ga, As, In, Sb, Te, Al or Si.

The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 μm to 1 mm. In order to avoid particles or fibers to stick to each other while the metal- or semimetal-containing compound is deposited onto them, it is preferably to keep them in motion. This can, for example, be achieved by stirring, by rotating drums, or by fluidized bed techniques.

The process according to the present invention comprises (a) depositing a metal- or semimetal-containing compound from the gaseous state onto a solid substrate. The metal- or semimetal-containing compound contains at least one metal or semimetal atom. Metals include Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Semimetals include B, Si, Ge, As, Sb, Se, Te. Preferably, the metal- or semimetal have an oxide formation energy per oxygen atom which is more exothermic than for Ni. In particular, the metal- or semimetal-containing compound contains Ti, Ta, Mn, Mo, W, Ge, Ga, As, In, Sb, Te, Al or Si. It is possible that more than one metal- or semimetal-containing compound is deposited on the surface, either simultaneously or consecutively. If more than one metal- or semimetal-containing compound is deposited on a solid substrate it is possible that all metal- or semimetal-containing compounds contain the same metal or semimetals or different ones, preferably they contain different metals or semimetals.

Any metal- or semimetal-containing compound, which can be brought into the gaseous state, is suitable. These compounds include metal or semimetal alkyls such as dimethyl zinc, trimethylaluminum; metal alkoxylates such as tetramethoxy silicon, tetra-isopropoxy zirconium or tetraisopropoxy titanium; metal or semimetal cyclopentadienyl complexes like pentamethylcyclopentadienyl-trimethoxy titanium or di(ethylcycopentadienyl) manganese; metal or semimetal carbenes such as tris(neopentyl)neopentylidene tantalum or bisimidazolidinyliden ruthenium chloride; metal or semimetal halides such as aluminum trichloride, tantalum pentachloride, titanium tetrachloride, molybdenum pentachloride, germanium tetrachloride, gallium trichloride, arsenic trichloride or tungsten hexachloride; carbon monoxide complexes like hexacarbonyl chromium or tetracarbonyl nickel; amine complexes such as bis(tert-butylimino)bis(dimethylamido)molybdenum, bis(tert-butylimino)bis(dimethylamido)tungsten or tetrakis(dimethylamido)titanium; diketonate complexes such as tris(acetylacetonato)aluminum or bis(2,2,6,6-tetramethyl-3,5-heptanedionato) manganese. Metal or semimetal halides are preferred, in particular aluminum chloride, aluminum bromide and aluminum iodide. It is preferred that the molecular weight of the metal- or semimetal-containing compound is up to 1000 g/mol, more preferred up to 800 g/mol, in particular up to 600 g/mol, such as up to 500 g/mol.

If the temperature of the substrate in the process according to the present invention is kept below the decomposition temperature of the metal- or semimetal-containing compound, typically a monolayer is deposited on the solid substrate. Once a molecule of the metal- or semimetal-containing compound is deposited on the solid substrate further deposition on top of it usually becomes less favored. Thus, the deposition of the metal- or semimetal-containing compound on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen und dielektrischen Materialeigenschaften sowie der Schichtdicke dünner Schichten mittels Ellipsometrie; February 2004).

The process according to the present invention comprises (b) bringing the solid substrate with the deposited metal- or semimetal-containing compound in contact with a compound of general formula (I) or (II). Z is $NR_2$, $PR_2$, OR, SR, $CR_2$, $SiR_2$, preferably $NR_2$, $PR_2$, OR, SR, in particular $NR_2$ or $PR_2$. The Z can all be the same or different to each other, preferably they are the same. X is H, R' or $NR'_2$, wherein at least one X is H, preferably at least one X for each Al atom is H, in particular all X are H, or one X for each Al atom is H and the other X is $NR'_2$ or R'. In the context of the present invention, H includes all isotopes of hydrogen, in particular $^1H$ and $^2H$. The latter is also referred to as deuterium D. The index n can be 1 or 2 depending on Z. Typically, if Z is $NR_2$, $PR_2$, OR, SR n is 2 and if Z is $CR_2$, $SiR_2$ n is 1.

R and R' in the compound of general formula (I) or (II) is an alkyl group, an alkenyl group, an aryl group, or a silyl group, preferably an alkyl group or silyl group, in particular methyl, ethyl, iso-propyl, sec-butyl, tert-butyl, trimethylsilyl. The R and R' can be the same or different from each other, preferably, all R are the same, preferably all R' are the same, in particular all R and R' are the same. It is possible that two R together form a ring, preferably a three to eight-membered ring, in particular a five- or six-membered ring.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, neo-pentyl, 2-ethylhexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl, ethyl, iso-propyl or tert-butyl.

An alkenyl group contains at least one carbon-carbon double bond. The double bond can include the carbon atom with which R or R' is bound to the rest of the molecule, or it can be placed further away from the place where R or R' is bound to the rest of the molecule. Alkenyl groups can be linear or branched. Examples for linear alkenyl groups in which the double bond includes the carbon atom with which R or R' is bound to the rest of the molecule include 1-ethenyl, 1-propenyl, 1-n-butenyl, 1-n-pentenyl, 1-n-hexenyl, 1-n-heptenyl, 1-n-octenyl. Examples for linear alkenyl groups in which the double bond is placed further away from the place where R or R' is bound to the rest of the molecule include 1-n-propen-3-yl, 2-buten-1-yl, 1-buten-3-yl, 1-buten-4-yl, 1-hexen-6-yl. Examples for branched alkenyl groups in which the double bond includes the carbon atom with which R or R' is bound to the rest of the molecule include 1-propen-2-yl, 1-n-buten-2-yl, 2-buten-2-yl, cyclopenten-1-yl, cyclohexen-1-yl. Examples for branched alkenyl groups in which the double bond is placed further away from the place where R' is bound to the rest of the molecule include 2-methyl-1-buten-4-yl, cyclopenten-3-yl, cyclohexene-3-yl. Examples for an alkenyl group with more than one double bond include 1,3-butadien-1-yl, 1,3-butadien-2-yl, cylopentadien-5-yl.

Aryl groups include aromatic hydrocarbons such as phenyl, naphthalyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains. Aromatic hydrocarbons are preferred, phenyl is more preferred.

A silyl group is a silicon atom with typically three substituents. Preferably a silyl group has the formula $SiE_3$, wherein E is independent of each other hydrogen, an alkyl group, an aryl group or a silyl group. It is possible that all three E are the same or that two E are the same and the remaining E is different or that all three E are different from each other, preferably all E are the same. Alkyl and aryl groups are as described above. Examples for silyl groups include $SiH_3$, methylsilyl, trimethylsilyl, triethylsilyl, tri-n-propylsilyl, tri-iso-propylsilyl, tricyclohexylsilyl, dimethyl-tert-butylsilyl, dimethylcyclohexylsilyl, methyl-di-iso-propylsilyl, triphenylsilyl, phenylsilyl, dimethylphenylsilyl, pentamethyldisilyl.

Preferably, the compound of general formula (I) is one of the following general formulae.

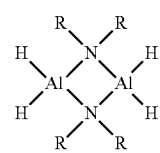
(Ia)

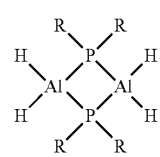
(Ib)

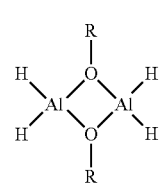
(Ic)

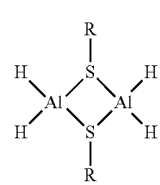
(Id)

-continued

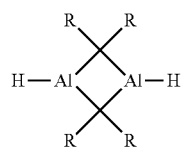
(Ie)

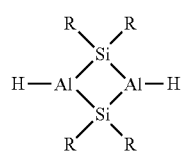
(If)

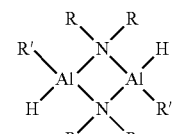
(Ig)

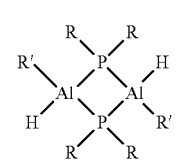
(Ih)

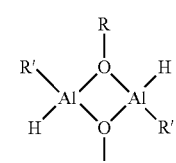
(Ii)

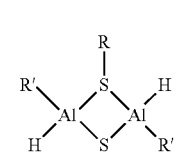
(Ij)

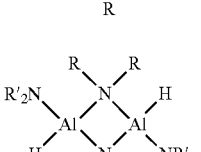
(Ik)

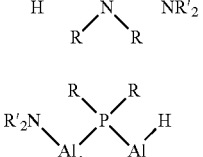
(Il)

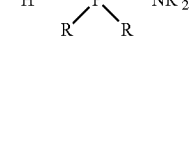
(Im)

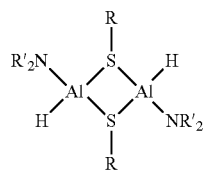

(Io)

Preferred examples for the compound of general formula (I) with reference to these general formulae are given in the following table.

| No. | Formula | R | R' |
|---|---|---|---|
| Ia-1 | Ia | Me | — |
| Ia-2 | Ia | Et | — |
| Ia-3 | Ia | —(CH₂)₂— | — |
| Ia-4 | Ia | —(CH₂)₄— | — |
| Ib-1 | Ib | Me | — |
| Ib-2 | Ib | Et | — |
| Ib-3 | Ib | —(CH₂)₂— | — |
| Ib-4 | Ib | —(CH₂)₄— | — |
| Ic-1 | Ic | Me | — |
| Ic-2 | Ic | Et | — |
| Ic-3 | Ic | —(CH₂)₂— | — |
| Ic-4 | Ic | —(CH₂)₄— | — |
| Id-1 | Id | Me | — |
| Id-2 | Id | Et | — |
| Id-3 | Id | —(CH₂)₂— | — |
| Id-4 | Id | —(CH₂)₄— | — |
| Ie-1 | Ie | Me | — |
| Ie-2 | Ie | Et | — |
| Ie-3 | Ie | —(CH₂)₂— | — |
| Ie-4 | Ie | —(CH₂)₄— | — |
| If-1 | If | Me | — |
| If-2 | If | Et | — |
| If-3 | If | —(CH₂)₂— | — |
| If-4 | If | —(CH₂)₄— | — |
| Ig-1 | Ig | Me | Me |
| Ig-2 | Ig | Et | Me |
| Ig-3 | Ig | Me | Et |
| Ig-4 | Ig | Et | Et |
| Ig-5 | Ig | —(CH₂)₂— | Me |
| Ig-6 | Ig | —(CH₂)₂— | Et |
| Ig-7 | Ig | —(CH₂)₄— | Me |
| Ig-8 | Ig | —(CH₂)₄— | Et |
| Ih-1 | Ih | Me | Me |
| Ih-2 | Ih | Et | Me |
| Ih-3 | Ih | Me | Et |
| Ih-4 | Ih | Et | Et |
| Ih-5 | Ih | —(CH₂)₂— | Me |
| Ih-6 | Ih | —(CH₂)₂— | Et |
| Ih-7 | Ih | —(CH₂)₄— | Me |
| Ih-8 | Ih | —(CH₂)₄— | Et |
| Ii-1 | Ii | Me | Me |
| Ii-2 | Ii | Et | Me |
| Ii-3 | Ii | Me | Et |
| Ii-4 | Ii | Et | Et |
| Ii-5 | Ii | —(CH₂)₂— | Me |
| Ii-6 | Ii | —(CH₂)₂— | Et |
| Ii-7 | Ii | —(CH₂)₄— | Me |
| Ii-8 | Ii | —(CH₂)₄— | Et |
| Ij-1 | Ij | Me | Me |
| Ij-2 | Ij | Et | Me |
| Ij-3 | Ij | Me | Et |
| Ij-4 | Ij | Et | Et |
| Ij-5 | Ij | —(CH₂)₂— | Me |
| Ij-6 | Ij | —(CH₂)₂— | Et |
| Ij-7 | Ij | —(CH₂)₄— | Me |
| Ij-8 | Ij | —(CH₂)₄— | Et |
| Ik-1 | Ik | Me | Me |
| Ik-2 | Ik | Et | Me |
| Ik-3 | Ik | Me | Et |
| Ik-4 | Ik | Et | Et |
| Ik-5 | Ik | —(CH₂)₂— | Me |
| Ik-6 | Ik | —(CH₂)₂— | Et |
| Ik-7 | Ik | —(CH₂)₄— | Me |
| Ik-8 | Ik | —(CH₂)₄— | Et |
| Im-1 | Im | Me | Me |
| Im-2 | Im | Et | Me |
| Im-3 | Im | Me | Et |
| Im-4 | Im | Et | Et |
| Im-5 | Im | —(CH₂)₂— | Me |
| Im-6 | Im | —(CH₂)₂— | Et |
| Im-7 | Im | —(CH₂)₄— | Me |
| Im-8 | Im | —(CH₂)₄— | Et |
| In-1 | In | Me | Me |
| In-2 | In | Et | Me |
| In-3 | In | Me | Et |
| In-4 | In | Et | Et |
| In-5 | In | —(CH₂)₂— | Me |
| In-6 | In | —(CH₂)₂— | Et |
| In-7 | In | —(CH₂)₄— | Me |
| In-8 | In | —(CH₂)₄— | Et |
| Io-1 | Io | Me | Me |
| Io-2 | Io | Et | Me |
| Io-3 | Io | Me | Et |
| Io-4 | Io | Et | Et |
| Io-5 | Io | —(CH₂)₂— | Me |
| Io-6 | Io | —(CH₂)₂— | Et |
| Io-7 | Io | —(CH₂)₄— | Me |
| Io-8 | Io | —(CH₂)₄— | Et |

Me stands for methyl, Et for ethyl, —(CH₂)₂— for an ethylene group which is formed by two R, —(CH₂)₄— for a butylene group which is formed by two R.

The synthesis for some of the compounds of general formula (I) is described for example by E. Ashby et al in Inorganic Chemistry, volume 10 (1971), pages 893-899 or by I. Krossing et al. in Zeitschrift für Naturforschung B, volume 63 (2008), pages 1045-1051.

Preferably, the compound of general formula (II) is one of the following general formulae.

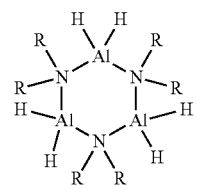

(IIa)

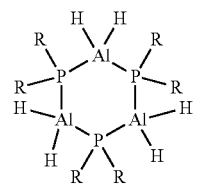

(IIb)

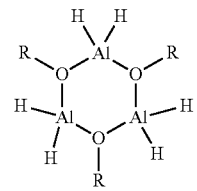

(IIc)

(IId)

(IIe)

(IIf)

(IIg)

(IIh)

(IIi)

(IIj)

(IIk)

(IIm)

(IIn)

(IIo)

Preferred examples for the compound of general formula (II) with reference to these general formulae are given in the following table.

| No. | Formula | R | R' |
|---|---|---|---|
| IIa-1 | IIa | Me | — |
| IIa-2 | IIa | Et | — |
| IIa-3 | IIa | —(CH$_2$)$_2$— | — |
| IIa-4 | IIa | —(CH$_2$)$_4$— | — |
| IIb-1 | IIb | Me | — |
| IIb-2 | IIb | Et | — |
| IIb-3 | IIb | —(CH$_2$)$_2$— | — |
| IIb-4 | IIb | —(CH$_2$)$_4$— | — |
| IIc-1 | IIc | Me | — |
| IIc-2 | IIc | Et | — |
| IIc-3 | IIc | —(CH$_2$)$_2$— | — |
| IIc-4 | IIc | —(CH$_2$)$_4$— | — |
| IId-1 | IId | Me | — |
| IId-2 | IId | Et | — |
| IId-3 | IId | —(CH$_2$)$_2$— | — |
| IId-4 | IId | —(CH$_2$)$_4$— | — |
| IIe-1 | IIe | Me | — |
| IIe-2 | IIe | Et | — |
| IIe-3 | IIe | —(CH$_2$)$_2$— | — |
| IIe-4 | IIe | —(CH$_2$)$_4$— | — |
| IIf-1 | IIf | Me | — |
| IIf-2 | IIf | Et | — |
| IIf-3 | IIf | —(CH$_2$)$_2$— | — |
| IIf-4 | IIf | —(CH$_2$)$_4$— | — |
| IIg-1 | IIg | Me | Me |
| IIg-2 | IIg | Et | Me |
| IIg-3 | IIg | Me | Et |
| IIg-4 | IIg | Et | Et |
| IIg-5 | IIg | —(CH$_2$)$_2$— | Me |
| IIg-6 | IIg | —(CH$_2$)$_2$— | Et |
| IIg-7 | IIg | —(CH$_2$)$_4$— | Me |
| IIg-8 | IIg | —(CH$_2$)$_4$— | Et |
| IIh-1 | IIh | Me | Me |
| IIh-2 | IIh | Et | Me |
| IIh-3 | IIh | Me | Et |
| IIh-4 | IIh | Et | Et |
| IIh-5 | IIh | —(CH$_2$)$_2$— | Me |
| IIh-6 | IIh | —(CH$_2$)$_2$— | Et |
| IIh-7 | IIh | —(CH$_2$)$_4$— | Me |
| IIh-8 | IIh | —(CH$_2$)$_4$— | Et |
| IIi-1 | IIi | Me | Me |
| IIi-2 | IIi | Et | Me |

-continued

| No. | Formula | R | R' |
|---|---|---|---|
| IIi-3 | IIi | Me | Et |
| IIi-4 | IIi | Et | Et |
| IIi-5 | IIi | —(CH$_2$)$_2$— | Me |
| IIi-6 | IIi | —(CH$_2$)$_2$— | Et |
| IIi-7 | IIi | —(CH$_2$)$_4$— | Me |
| IIi-8 | IIi | —(CH$_2$)$_4$— | Et |
| IIj-1 | IIj | Me | Me |
| IIj-2 | IIj | Et | Me |
| IIj-3 | IIj | Me | Et |
| IIj-4 | IIj | Et | Et |
| IIj-5 | IIj | —(CH$_2$)$_2$— | Me |
| IIj-6 | IIj | —(CH$_2$)$_2$— | Et |
| IIj-7 | IIj | —(CH$_2$)$_4$— | Me |
| IIj-8 | IIj | —(CH$_2$)$_4$— | Et |
| IIk-1 | IIk | Me | Me |
| IIk-2 | IIk | Et | Me |
| IIk-3 | IIk | Me | Et |
| IIk-4 | IIk | Et | Et |
| IIk-5 | IIk | —(CH$_2$)$_2$— | Me |
| IIk-6 | IIk | —(CH$_2$)$_2$— | Et |
| IIk-7 | IIk | —(CH$_2$)$_4$— | Me |
| IIk-8 | IIk | —(CH$_2$)$_4$— | Et |
| IIm-1 | IIm | Me | Me |
| IIm-2 | IIm | Et | Me |
| IIm-3 | IIm | Me | Et |
| IIm-4 | IIm | Et | Et |
| IIm-5 | IIm | —(CH$_2$)$_2$— | Me |
| IIm-6 | IIm | —(CH$_2$)$_2$— | Et |
| IIm-7 | IIm | —(CH$_2$)$_4$— | Me |
| IIm-8 | IIm | —(CH$_2$)$_4$— | Et |
| IIn-1 | IIn | Me | Me |
| IIn-2 | IIn | Et | Me |
| IIn-3 | IIn | Me | Et |
| IIn-4 | IIn | Et | Et |
| IIn-5 | IIn | —(CH$_2$)$_2$— | Me |
| IIn-6 | IIn | —(CH$_2$)$_2$— | Et |
| IIn-7 | IIn | —(CH$_2$)$_4$— | Me |
| IIn-8 | IIn | —(CH$_2$)$_4$— | Et |
| IIo-1 | IIo | Me | Me |
| IIo-2 | IIo | Et | Me |
| IIo-3 | IIo | Me | Et |
| IIo-4 | IIo | Et | Et |
| IIo-5 | IIo | —(CH$_2$)$_2$— | Me |
| IIo-6 | IIo | —(CH$_2$)$_2$— | Et |
| IIo-7 | IIo | —(CH$_2$)$_4$— | Me |
| IIo-8 | IIo | —(CH$_2$)$_4$— | Et |

Me stands for methyl, Et for ethyl, —(CH$_2$)$_2$— for an ethylene group which is formed by two R, —(CH$_2$)$_4$— for a butylene group which is formed by two R.

The synthesis for some of the compounds of general formula (II) is described for example by K. Ouzounis et al. in Zeitschrift fuer Anorganische und Allgemeine Chemie, volume 504 (1983) pages 67-76 or by A. Storr et al. in Journal of the Chemical Society, Dalton Transactions: Inorganic Chemistry (1972-1999), 1972, pages 326-330.

Preferably, R bears no hydrogen atom in the 1-position, i.e. R bears no hydrogen atom which is bonded to the atom which is bonded to the nitrogen or oxygen atom, which is thus in the beta-position with regard to the aluminum atom. Also preferably, R' bears no hydrogen atom in the 1-position. More preferably, both R and R' bear no hydrogen in the 1-position. Examples are alkyl group bearing two alkyl side groups in the 1-position, i.e. 1,1-dialkylalkyl, such as tert-butyl, 1,1-dimethylpropyl; alkyl groups with two halogens in the 1-position such as trifluoromethyl, trichloromethyl, 1,1-difluoroethyl; trialkylsilyl groups such as trimethylsilyl, triethylsilyl, dimethyltert-butylsilyl; aryl groups, in particular phenyl or alkyl-substituted phenyl such as 2,6-diisopropylphenyl, 2,4,6-triisopropylphenyl. Alkyl groups bearing no hydrogen atom in the 1-position are particularly preferred.

The compound of general formula (I) or (II) preferably has a molecular weight of not more than 1000 g/mol, more preferably not more than 800 g/mol, even more preferably not more than 600 g/mol, in particular not more than 500 g/mol.

Preferably, the compound of general formula (I) or (II) has a melting point ranging from −80 to 125° C., preferably from −60 to 80° C., even more preferably from −40 to 50° C., in particular from −20 to 20° C. It is advantageous if the compound of general formula (I) or (II) melts to give a clear liquid which remains unchanged until a decomposition temperature.

Preferably, the compound of general formula (I) or (II) has a decomposition temperature of at least 80° C., more preferably at least 100° C., in particular at least 120° C., such as at least 150° C. Often, the decomposition temperature is not more than 250° C. The compound of general formula (I) or (II) has a high vapor pressure. Preferably, the vapor pressure is at least 1 mbar at a temperature of 200° C., more preferably at 150° C., in particular at 120° C. Usually, the temperature at which the vapor pressure is 1 mbar is at least 50° C.

The compound of general formula (I) or (II) used in the process according to the present invention are used at high purity to achieve the best results. High purity means that the substance used contains at least 90 wt.-% metal- or semi-metal-containing compound or compound of general formula (I) or (II), preferably at least 95 wt.-%, more preferably at least 98 wt.-%, in particular at least 99 wt.-%. The purity can be determined by elemental analysis according to DIN 51721 (Prüfung fester Brennstoffe—Bestimmung des Gehaltes an Kohlenstoff und Wasserstoff—Verfahren nach Radmacher-Hoverath, August 2001).

The compound of general formula (I) or (II) is brought in contact with the solid substrate from the gaseous state. It can be brought into the gaseous state for example by heating it to elevated temperatures. In any case a temperature below the decomposition temperature of the compound of general formula (I) or (II) has to be chosen. The decomposition temperature is the temperature at which the pristine compound of general formula (I) or (II) begins changing its chemical structure and composition. Preferably, the heating temperature ranges from 0° C. to 300° C., more preferably from 10° C. to 250° C., even more preferably from 20° C. to 200° C., in particular from 30° C. to 150° C.

Another way of bringing the compound of general formula (I) or (II) into the gaseous state is direct liquid injection (DLI) as described for example in US 2009/0 226 612 A1. In this method the compound of general formula (I) or (II) is typically dissolved in a solvent and sprayed in a carrier gas or vacuum. If the vapor pressure of the compound of general formula (I) or (II) and the temperature are sufficiently high and the pressure is sufficiently low the compound of general formula (I) or (II) is brought into the gaseous state. Various solvents can be used provided that the compound of general formula (I) or (II) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable.

Alternatively, the compound of general formula (I) or (II) can be brought into the gaseous state by direct liquid evaporation (DLE) as described for example by J. Yang et al. (Journal of Materials Chemistry, 2015). In this method, the compound of general formula (I) or (II) is mixed with a solvent, for example a hydrocarbon such as tetradecane, and heated below the boiling point of the solvent. By evaporation of the solvent, the compound of general formula (I) or (II) is brought into the gaseous state. This method has the advantage that no particulate contaminants are formed on the surface.

It is preferred to bring the compound of general formula (I) or (II) into the gaseous state at decreased pressure. In this way, the process can usually be performed at lower heating temperatures leading to decreased decomposition of the compound of general formula (I) or (II). It is also possible to use increased pressure to push the compound of general formula (I) or (II) in the gaseous state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

The exposure of the substrate with the compound of general formula (I) or (II) or the metal- or semimetal-containing compound can take from milliseconds to several minutes, preferably from 0.1 second to 1 minute, in particular from 1 to 10 seconds. The longer the solid substrate at a temperature below the decomposition temperature of the compound of general formula (I) or (II) or the metal- or semimetal-containing compound is exposed to the compound of general formula (I) or (II) or the metal- or semimetal-containing compound the more regular films are formed with less defects.

Preferably, the compound of general formula (I) or (II) acts as reducing agent in the process. In this case, a metal- or semimetal-containing compound is deposited from the gaseous state onto the solid substrate before bringing it in contact with a compound of general formula (I) or (II). The metal- or semimetal-containing compound is usually reduced to a metal, a metal nitride, a metal carbide, a metal carbonitride, a metal alloy, an intermetallic compound or mixtures thereof, wherein the metal or semimetal has a lower oxidation state after reduction than before. Metal films in the context of the present invention are metal- or semimetal-containing films with high electrical conductivity, usually at least $10^4$ S/m, preferably at least $10^5$ S/m, in particular at least $10^6$ S/m.

The compound of general formula (I) or (II) has a low tendency to form a permanent bond with the surface of the solid substrate with the deposited metal- or semimetal-containing compound. As a result, the metal- or semimetal-containing film has a level of impurities resulting from incorporation of the reaction by-products of the compound of general formula (I) or (II). Preferably, the metal- or semimetal-containing film contains in sum less than 5 weight-% nitrogen, more preferably less than 1 wt.-%, in particular less than 0.5 wt.-%, such as less than 0.2 wt.-%.

A particular advantage of the process according to the present invention is that the compound of general formula (I) or (II) is very versatile, so the process parameters can be varied in a broad range. Therefore, the process according to the present invention includes both a CVD process as well as an ALD process.

Preferably, the sequence comprising (a) and (b) is performed at least twice, more preferably at least five times, even more preferably at least 10 times, in particular at least 50 times. Often, the sequence comprising (a) and (b) is performed not more than 1000 times.

Generally, it is preferred to purge the substrate and its surrounding apparatus with an inert gas each time the solid substrate is exposed to the metal- or semimetal-containing compound or the compound of general formula (I) or (II) in the gaseous state. Preferred examples for inert gases are nitrogen and argon. Purging can take 1 s to 1 min, preferably 5 to 30 s, more preferably from 10 to 25 s, in particular 15 to 20 s.

Preferably, the temperature of the substrate is 5° C. to 40° C. higher than the place where the metal- or semimetal-containing compound is brought into the gaseous state, for example 20° C. Preferably, the temperature of the substrate is from room temperature to 400° C., more preferably from 100 to 300° C., such as 150 to 220° C.

Preferably, after deposition of a metal- or semimetal-containing compound on the solid substrate and before bringing the solid substrate with the deposited metal- or semimetal-containing compound in contact with the compound of general formula (I) or (II), the solid substrate with the deposited metal- or semimetal-containing compound is brought in contact with an acid in the gaseous phase. Without being bound by a theory, it is believed that the protonation of the ligands of the metal- or semimetal-containing compound facilitates its decomposition and reduction. Suitable acids include hydrochloric acid and carboxylic acids, preferably, carboxylic acids such as formic acid, acetic acid, propionic acid, butyric acid, or trifluoroacetic acid, in particular formic acid.

The process according to the present invention yields an inorganic metal- or semimetal-containing film. A film can be only one monolayer of a metal or be thicker such as 0.1 nm to 1 μm, preferably 0.5 to 50 nm. A film can contain defects like holes. These defects, however, generally constitute less than half of the surface area covered by the film. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element. Electronic elements can have structural features of various sizes, for example from 1 nm to 100 μm, for example 10 nm, 14 nm or 22 nm. The process for forming the films for the electronic elements is particularly well suited for very fine structures. Therefore, electronic elements with sizes below 1 μm are preferred. Examples for electronic elements are field-effect transistors (FET), charge-trap memory cells, solar cells, light emitting diodes, sensors, or capacitors. In optical devices such as light emitting diodes or light sensors the film obtained by the process according to the present invention serves to increase the refractive index of the layer which reflects light.

Preferred electronic elements are transistors. Preferably the film acts as chemical barrier metal in a transistor. A chemical barrier metal is a material which reduces diffusion of adjacent layers while maintaining electrical connectivity.

EXAMPLES

Example 1

An atomic layer deposition process was carried out using $GeBr_4$ as a semimetal-containing compound and compound IIa-1. Each of these compounds was contained in a stainless-steel cylinder and connected to a crossflow ALD reactor with a 1 inch diameter deposition area and an Ar (5N) carrier gas flow of 5 sccm. The base pressure was approximately 50 Pa. The $GeBr_4$ was heated to 55° C. and compound IIa-1 was heated to 75° C. 100 ALD cycles, each comprising a sequence of a 100 ms $GeBr_4$ exposure, first 7.9 s purge, 100 ms compound IIa-1 exposure and second 7.9 s purge, were run and monitored by an in situ quartz crystal microbalance (QCM). At reactor temperatures of 160° C. to 200° C., the average QCM frequency change was observed to be −1 Hz/cycle, indicating a steady mass increase and the existence of an ALD window of temperature-independent growth rate. The GeBr$_4$ exposure resulted in a mass increase, whereas the mass was decreased by the subsequent exposure with compound IIa-1, indicating a specific reactivity of compound IIa-1 with the surface generated by GeBr$_4$ exposure, but no deposition of compound IIa-1.

Example 2

The same apparatus, compounds and ALD cycle as in example 1 were used. Blanket Si wafer substrates with either the native oxide or a 100 nm thermal oxide surface were placed in the reactor and were held at a temperature of 160° C. 1000 ALD cycles as described in example 1 were performed and the substrates were analyzed after removal from the reactor. A layer of approximately 14 nm thickness, as determined by ellipsometry, was deposited on the native oxide wafer substrate. The rms roughness of a similar ALD layer deposited on a thermal oxide substrate was found to be 2 nm according to AFM analysis.

Example 3

The same apparatus as in example 1 was used. GeCl$_4$ as a semimetal-containing compound and compound IIa-1 were used. GeCl$_4$ was contained in a stainless-steel cylinder and kept at 0° C. during the ALD process. 100 ALD cycles, each comprising a sequence of a 20 ms GeCl$_4$ exposure, a 7.98 s purge, a 100 ms compound IIa-1 exposure and a 7.9 s purge, were run and monitored by an in situ quartz crystal microbalance (QCM). At a reactor temperature of 140° C. the average QCM frequency change was −0.4 Hz/cycle, indicating a steady mass increase. The GeCl$_4$ exposure resulted in a mass increase, whereas the mass was decreased by the subsequent exposure with compound IIa-1, indicating a specific reactivity of compound IIa-1 with the surface generated by GeCl$_4$ exposure, but no deposition of compound IIa-1.

The invention claimed is:

1. A process for preparing inorganic metal- or semimetal-containing films comprising
   (a) depositing a metal- or semimetal-containing compound from the gaseous state onto a solid substrate and
   (b) bringing the solid substrate with the deposited metal- or semimetal-containing compound in contact with a compound of general formula (II)

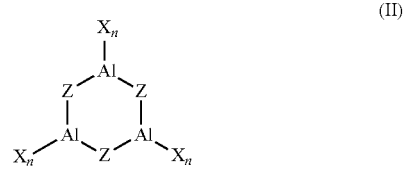

wherein Z is NR$_2$, PR$_2$, OR, SR, CR$_2$, SiR$_2$,
X is H, R' or NR'$_2$, wherein at least one X is H,
n is 1 or 2, and
R and R' is an alkyl group, an alkenyl group, an aryl group, or a silyl group;
wherein the compound of general formula (II) acts as a reducing agent.

2. The process according to claim 1, wherein R is methyl, ethyl, iso-propyl, sec-butyl, tert-butyl, trimethylsilyl.

3. The process according to claim 1, wherein at least one X for each Al atom is H.

4. The process according to a claim 1, wherein Z is NR$_2$, PR$_2$, OR, or SR.

5. The process according to a claim 1, wherein the metal- or semimetal-containing compound contains Ti, Ta, Mn, Mo, W, Ge, Ga, As, In, Sb, Te, Al or Si.

6. The process according to claim 1, wherein the metal- or semimetal-containing compound is a metal or semimetal halide.

7. The process according to claim 1, wherein the sequence containing (a) and (b) is performed at least twice.

8. The process according to claim 1, wherein the compound of general formula (II) has a molecular weight of not more than 600 g/mol.

9. The process according to claim 1, wherein the compound of general formula (II) has a vapor pressure at least 1 mbar at a temperature of 200° C.

10. Use of a compound of general formula (II) as reducing agent in a vapor deposition process.

11. The process according to claim 1, wherein the in the metal- or semimetal-containing compound is selected from the group consisting of Li, Be, Na, Mg, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Bi, B, Si, Ge, As, Sb, Se, or Te.

* * * * *